United States Patent
Kim et al.

(10) Patent No.: US 7,307,002 B2
(45) Date of Patent: Dec. 11, 2007

(54) NON-CRITICAL COMPLEMENTARY MASKING METHOD FOR POLY-1 DEFINITION IN FLASH MEMORY DEVICE FABRICATION

(75) Inventors: Unsoon Kim, San Jose, CA (US); Hiroyuki Kinoshita, Sunnyvale, CA (US); Yu Sun, Saratoga, CA (US); Krishnashree Achuthan, San Ramon, CA (US); Christopher H. Raeder, Austin, TX (US); Christopher M. Foster, Austin, TX (US); Harpreet Kaur Sachar, Sunnyvale, CA (US); Kashmir Singh Sahota, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 287 days.

(21) Appl. No.: 11/099,339

(22) Filed: Apr. 4, 2005

(65) Prior Publication Data

US 2006/0223278 A1    Oct. 5, 2006

(51) Int. Cl.
*H01L 21/76* (2006.01)

(52) U.S. Cl. ............... 438/427; 438/424; 257/E21.545
(58) Field of Classification Search ............... 438/424, 438/427, 200; 257/E21.545
See application file for complete search history.

(56) References Cited

U.S. PATENT DOCUMENTS

| 4,145,020 | A | 3/1979 | Webster ................. 248/161 |
| 6,924,220 | B1* | 8/2005 | Yang et al. ............. 438/593 |
| 2002/0061616 | A1* | 5/2002 | Kim et al. ............... 438/200 |
| 2004/0014269 | A1 | 1/2004 | Kim et al. ............... 438/201 |

FOREIGN PATENT DOCUMENTS

WO    WO 01/41199    6/2001

\* cited by examiner

*Primary Examiner*—Bradley K. Smith

(57) ABSTRACT

A method is disclosed for the definition of the poly-1 layer in a semiconductor wafer. A non-critical mask is used to recess field oxides in the periphery prior to poly-1 deposition by an amount equal to the final poly-1 thickness. A complimentary non-critical mask is used to permit CMP of the core to expose the tops of core oxide mesas from the shallow isolation trenches.

10 Claims, 13 Drawing Sheets

NON-CRITICAL COMPLEMENTARY MASKING METHOD FOR POLY-1 DEFINITION IN FLASH MEMORY DEVICE FABRICATION

FIELD

The present invention relates to semiconductor wafer fabrication. Specifically, the present invention relates to a method for using complimentary non-critical masks to define the first polysilicon, or "poly-1" layer during flash memory device fabrication.

BACKGROUND

According to Moore's Law, the historical trend of the semiconductor industry, the level of complexity of semiconductor devices doubles every eighteen months. The size of the smallest structure in a semiconductor device now is 70% the size of the smallest structure three years ago. As structure size shrinks, chips become more densely populated permitting faster and more powerful machines. The aim of engineers within the semiconductor industry is to constantly find ways to pack more structures on each chip while maintaining fabrication process robustness and keeping the consumer cost per function to a minimum.

One set of the hundreds of steps in the semiconductor wafer fabrication process for flash memory devices is devoted to the definition of the first polysilicon, or "poly-1" layer above the substrate 101 (shown in FIG. 1). FIG. 1 is a cross-sectional view of a semiconductor wafer in one stage of the fabrication process. Before the deposition of the poly-1 layer, trenches 103 are formed in the substrate. Trench etch into silicon substrate 101 is performed through conventional methods by depositing a layer of barrier oxide and a nitride layer (ON) 102 is used as an etch mask.

Following trench formation, the trenches are over-filled with a dielectric oxide material 106, or "field oxide," as shown in FIG. 2. As illustrated in FIG. 3, the wafer is then polished by a Chemical Mechanical Polish, or Chemical Mechanical Planarization (CMP) process 107 to remove the excess field oxide from on top of the nitride layer 102. The effect of CMP 107 is depicted in FIG. 4. Then, the nitride layer 102 is stripped with an etch or polish process 108, shown in FIG. 5. It is important that after the nitride strip, the remaining field oxide trench-fills form mesas 109 which protrude from the substrate, as shown in FIG. 6. The height of these mesas 109 is determined by the thickness 118 of the nitride layer of the ON mask 102. Using a conventional method, the thickness of the nitride layer is approximately 700-1500 angstroms.

Filled trenches may be used to isolate devices from each other in the core 104, a technique known as Shallow Trench Isolation (STI). STI has emerged as the primary technique for device isolation for advanced Ultra Large Scale Integration (ULSI) Complimentary Metal-Oxide-Semiconductor (CMOS) technologies. Filled trenches may also be utilized in the periphery 105 for the active transistor isolation.

The next step in the conventional method is poly-1 110 deposition, shown in FIG. 7, followed by poly-1 definition. The definition of the poly-1 layer is complicated by two factors. The first of these factors is that in the core 104, the mesas of trench-fill oxides 109 must not be covered by polysilicon 110, while the mesas of trench-fill oxides in the periphery 117 must be covered by a layer of polysilicon 110 of a certain thickness 116, as shown in FIG. 8.

In order to achieve proper poly-1 definition, the conventional method employs a mask and etch process. As FIG. 8 depicts, a mask 111 is lithographically applied to the top of the poly-1 layer 110. FIG. 9 illustrates how in the conventional method, once the poly-1 definition mask 111 is applied, an etch 113 is performed to remove polysilicon 110 from on top of the core mesas 109, as shown in FIG. 10. A stripping process 115, shown in FIG. 11, is then employed to remove the poly-1 definition mask 111. Once the poly 1 definition mask 111 is removed, as shown in FIG. 12, the poly-1 layer 110 is properly defined and the wafer proceeds to the rest of the fabrication process.

Proper alignment of the poly-1 definition mask is imperative. A misalignment of the poly-1 definition mask could result in portions of the poly-1 layer overlapping onto sensitive areas, which could compromise the optimum functioning of the chips, or perhaps render the entire wafer useless.

SUMMARY

Embodiments of the present invention, a method for poly-1 definition in the semiconductor wafer fabrication process using complimentary non-critical masks, are presented. Layers of barrier oxide and nitride (700-1600 Å) are used to define the trenches in the substrate. The STI trenches are over-filled with oxide material. The wafer is polished to remove excess oxide material from on top of the barrier oxide and nitride layers, and before the nitride layer is stripped, a first non-critical mask is applied to core areas, leaving the periphery and scribe line areas exposed. An etch is applied to recess the exposed oxide material in the periphery by an amount approximately equal to the desired final poly-1 thickness. After the first non-critical mask is stripped, the nitride layer is also stripped, followed by poly-1 deposition. A thin oxide or other hard masking layer is deposited, followed by the application of a second non-critical mask over the periphery. The exposed thin hard mask is etched away, and the second non-critical mask is stripped, leaving a thin hard mask over the periphery and the core exposed. CMP is applied to the core until the tops of the core oxide mesas are exposed. Then remaining thin hard mask is stripped, leaving behind a properly defined poly-1 layer.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Reference will now be made in detail to various embodiments of the invention, examples of which are illustrated in the accompanying drawings. While the invention will be described in conjunction with various embodiments, it will be understood that they are not intended to limit the invention to these embodiments. On the contrary, the invention is intended to cover alternatives, modifications and equivalents, which may be included within the spirit and the scope of the invention as defined by the appended claims. Furthermore, in the following detailed description of the present invention, numerous specific details are set forth in order to provide a thorough understanding of the present invention. However, it will be apparent to one skilled in the art that the present invention may be practiced without these specific details. In other instances, well-known methods, procedures, components, structures and devices have not been described in detail so as to avoid unnecessarily obscuring aspects of the present invention.

Figure 1:
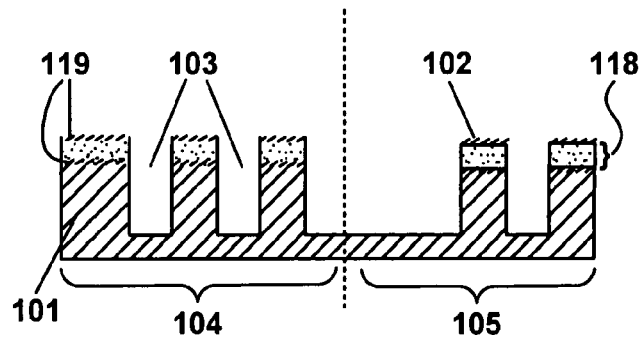
FIG. 1 illustrates a cross-section of a semiconductor substrate 101 and trench formation masking layer 102 in accordance with the prior art method of poly-1 definition.
Figure 2:
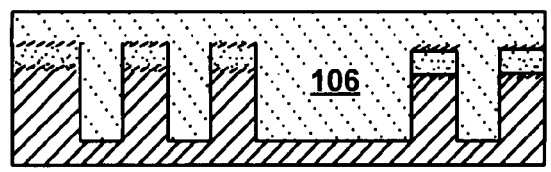
FIG. 2 illustrates a cut-away view of a subsequent stage of the prior art process.
Figure 3:
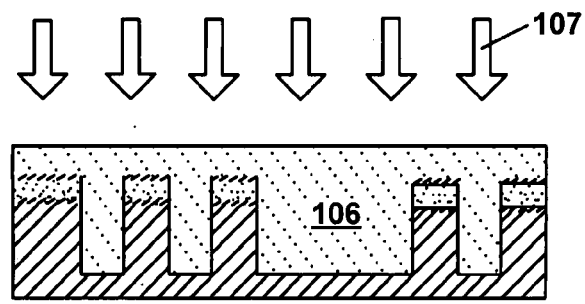
FIG. 3 illustrates a cut-away view of a subsequent stage of the prior art process.
Figure 4:
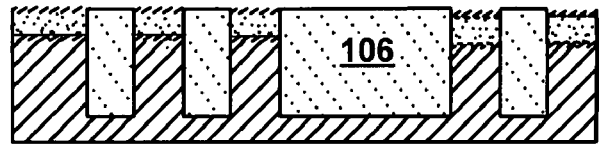
FIG. 4 illustrates a cut-away view of a subsequent stage of the prior art process.
Figure 5:
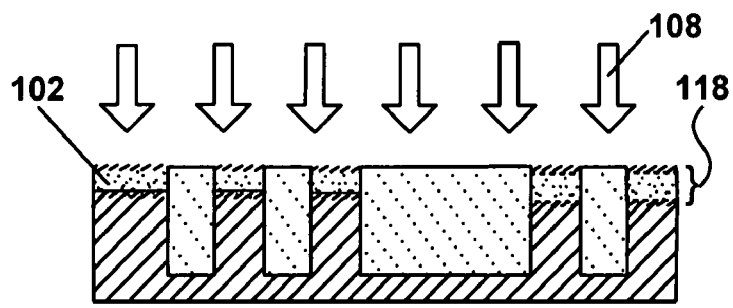
FIG. 5 illustrates a cut-away view of a subsequent stage of the prior art process.
Figure 6:
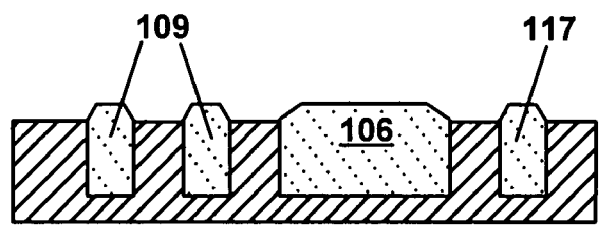
FIG. 6 illustrates a cut-away view of a subsequent stage of the prior art process.
Figure 7:
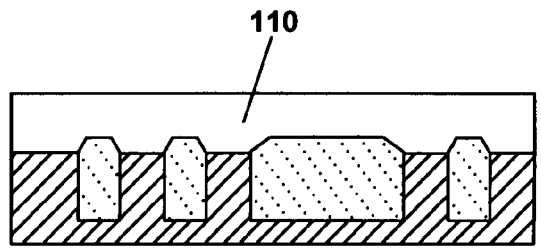
FIG. 7 illustrates a cut-away view of a subsequent stage of the prior art process.
Figure 8:
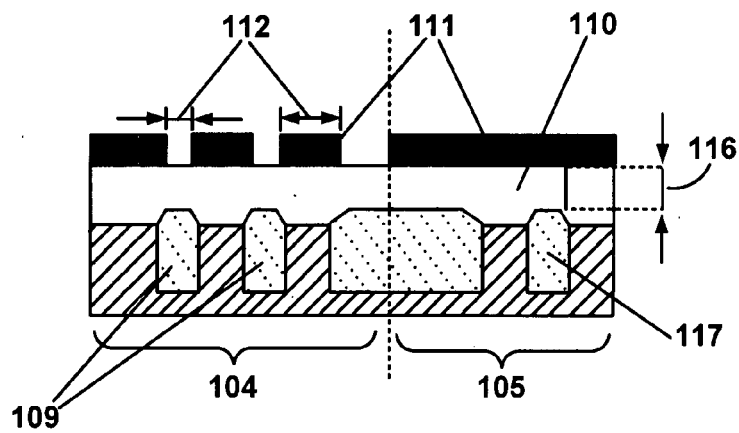
FIG. 8 illustrates a cut-away view of a subsequent stage of the prior art process.
Figure 9:
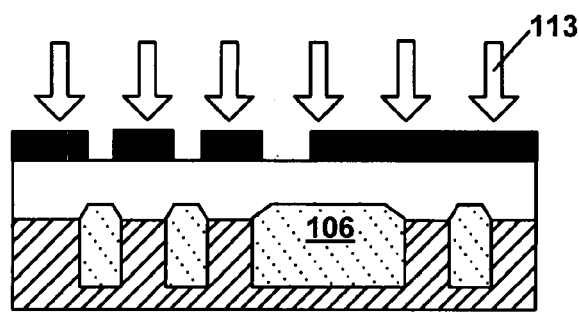
FIG. 9 illustrates a cut-away view of a subsequent stage of the prior art process.
Figure 10:
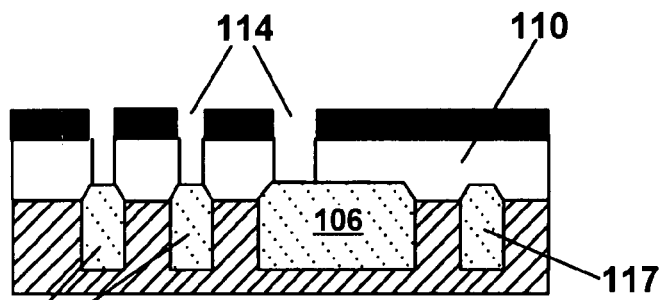
FIG. 10 illustrates a cut-away view of a subsequent stage of the prior art process.
Figure 11:
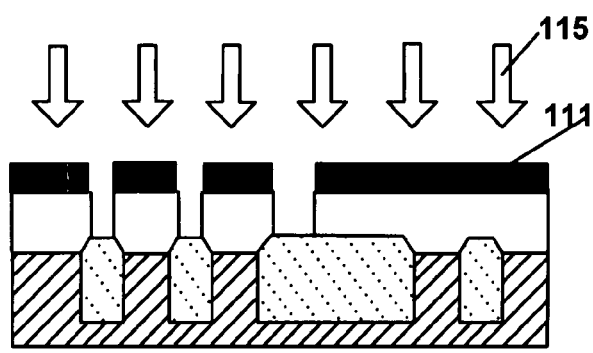
FIG. 11 illustrates a cut-away view of a subsequent stage of the prior art process.
Figure 12:
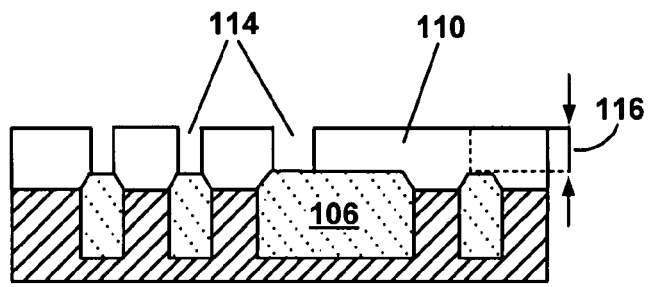
FIG. 12 illustrates a cut-away view of a subsequent stage of the prior art process.
Figure 13:
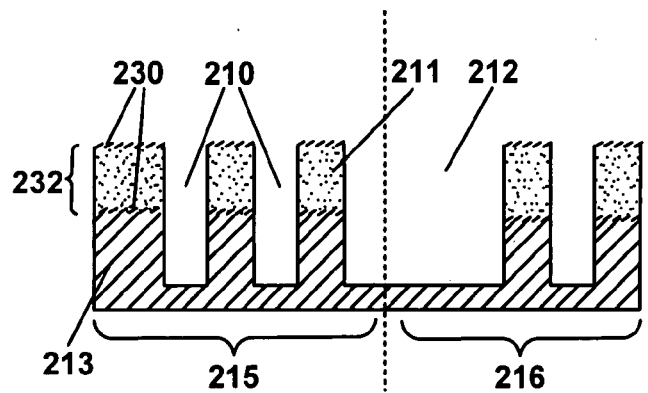
FIG. 13 illustrates a cross-section of a semiconductor substrate 13 and trench formation masking layer 11 in accordance with the present invention method of poly-1 definition.

Referring now to FIG. 13, a cross-section view of a semiconductor wafer, a patterned barrier oxide and nitride layers 232 are used to etch trenches 210 in the substrate 213, both in the core 215 and in the periphery 216 areas of the wafer. Some of the etched trenches 210 are shallow isolation trenches. Shallow trench isolation (STI) has become the preferred technique for isolating devices from each other on the chip. STI prevents leakage of ions in designated doped areas in the substrate, as well as other unwanted electronic interference between devices. Some of the trenches 212 etched into substrate 213 form the foundation for test structures or other periphery structures 218. Some trenches 218 require a layer of polysilicon on top of the oxide fill material.

The thickness of the nitride layer 211 can be varied. In a preferred embodiment of the present invention, the thickness 227 of the nitride layer 211 is approximately 1580 Å.

Figure 14:
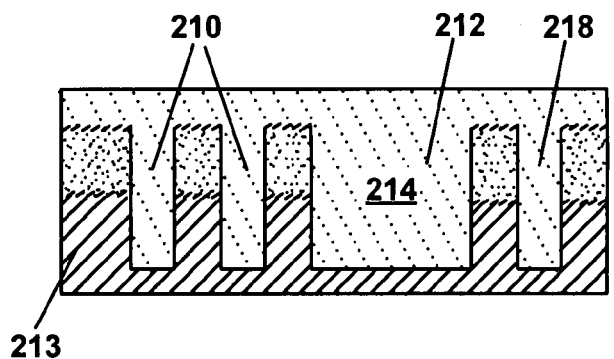
FIG. 14 illustrates a cut-away view of a subsequent stage of the present invention process.
Figure 15:
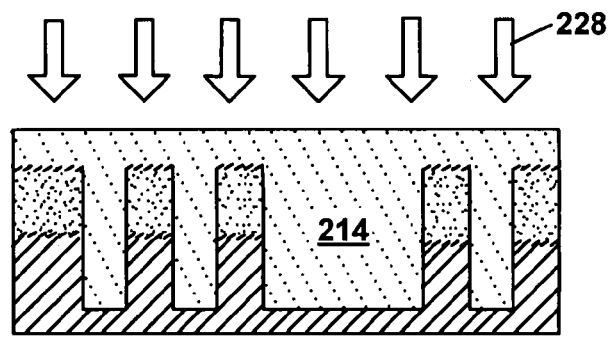
FIG. 15 illustrates a cut-away view of a subsequent stage of the present invention process.
Figure 16:
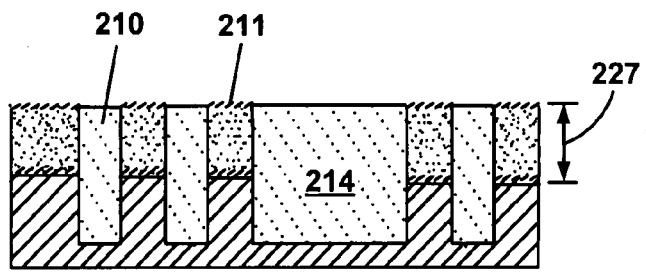
FIG. 16 illustrates a cut-away view of a subsequent stage of the present invention process.

Once the trenches are formed in the substrate 213, the trenches 212 are filled with a dielectric oxide material 214, as shown in FIG. 14. In a preferred embodiment, trenches 212 are filled by a High Density Plasma (HDP) process with silicon dioxide. In another embodiments, a TEOS (tetraethylorthosilicate) deposition process is employed. The trenches 212 are over-filled, as FIG. 14 illustrates, such that the barrier oxide and nitride pattern layers 232 are covered with the oxide material 214. Overfilling of the oxide material 214 into the trenches 212 ensures that the trenches 212 are sufficiently filled for STI. Then, as FIG. 15 shows, a polish 228 is performed. In a preferred embodiment, CMP 228 is performed to remove excess oxide material. In a preferred embodiment, polishing process 215 stops when the top of the nitride layer 211 is exposed, as depicted in FIG. 16.

Figure 17:
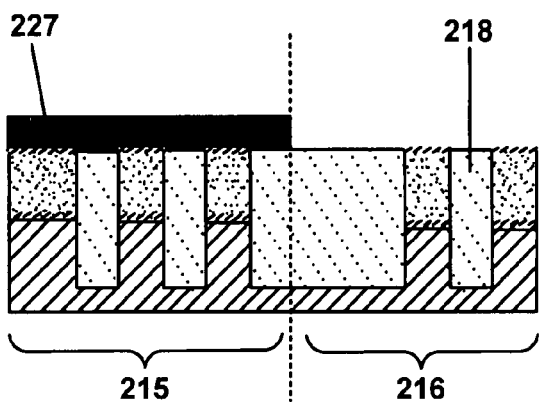
FIG. 17 illustrates a cut-away view of a subsequent stage of the present invention process.

Once the polishing process 228 is complete, a first non-critical mask 217 is applied to a core region 215 of the wafer, as shown in FIG. 17. The first non-critical mask 217 covers the core 215 and leaves the periphery 216 exposed. The first non-critical mask 217 can be created using i-line lithography. I-line lithography utilizes ultraviolet radiation to permit a masking resolution of 300-400 nm, which is sufficient to accomplish poly-1 definition according to the present invention method. I-line lithography has a must lower cost per layer than ArF lithography.

Figure 18:
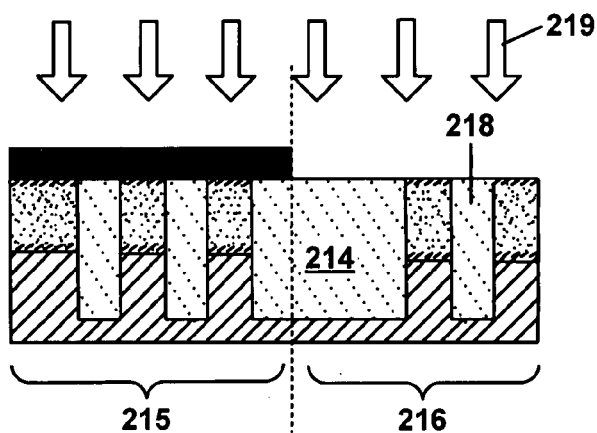
FIG. 18 illustrates a cut-away view of a subsequent stage of the present invention process.
Figure 19:
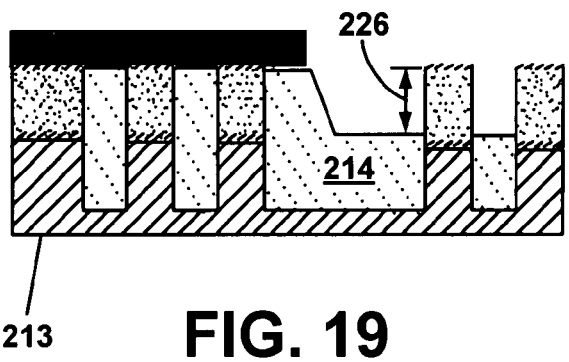
FIG. 19 illustrates a cut-away view of a subsequent stage of the present invention process.

The application of the first non-critical mask 217 is followed by an etch 219, depicted in FIG. 18, to recess exposed oxide material 214 in the trenches 218 of the periphery 216 by an amount 226 approximately equal to the final poly-1 thickness. The result of etch 219 is depicted in FIG. 19. The oxide material 214 within the trenches 210 in the core region 215 are not etched, as they are covered by the first non-critical mask 217.

Figure 20:
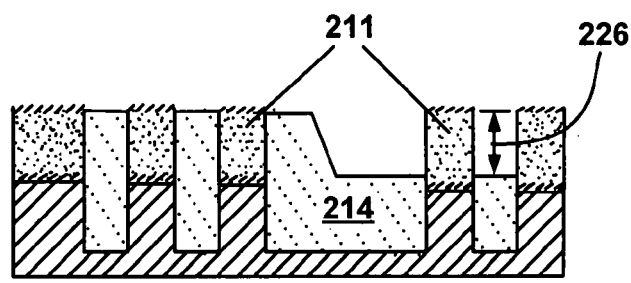
FIG. 20 illustrates a cut-away view of a subsequent stage of the present invention process.
Figure 21:
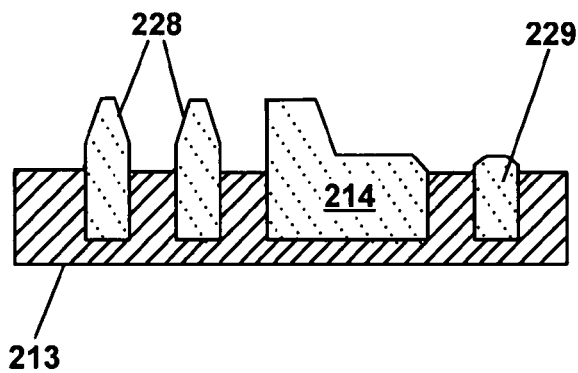
FIG. 21 illustrates a cut-away view of a subsequent stage of the present invention process.

Once the first non-critical mask 217 is stripped (FIG. 20), the nitride 232 layer is stripped (FIG. 21). The stripping of the nitride layer 232 leaves behind trench fill mesas 228 made of the oxide material 214. It is important that these oxide mesas 228 protrude above the substrate and laterally recessed due to subsequent oxidation and clean steps. The core oxide mesas 228 are taller than the periphery oxide mesas 229. In a preferred embodiment of the present invention, the core oxide mesas protrude out of the substrate by a height in the range of 600-1500 Å. Tall "field oxide" areas where poly-1 will later be damascened, and other areas which are recessed with the first non-critical mask where poly-1 will not be damascened.

Figure 22:
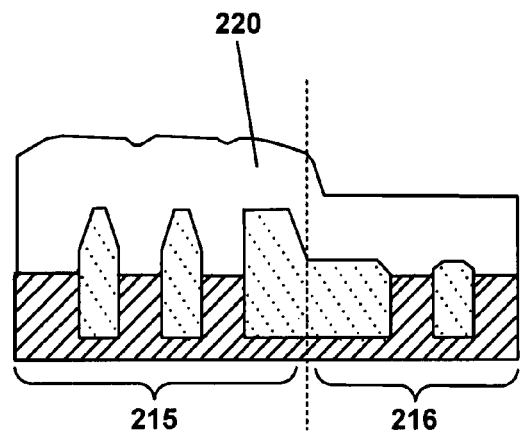
FIG. 22 illustrates a cut-away view of a subsequent stage of the present invention process.
Figure 23:
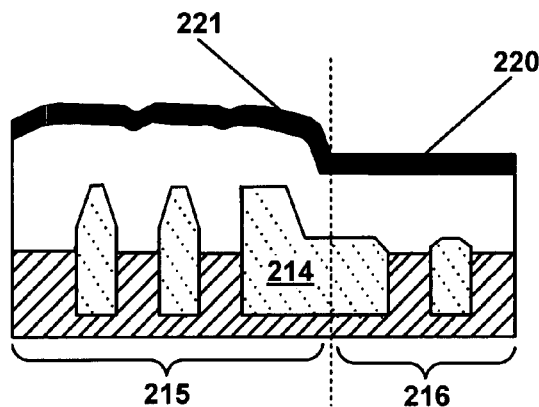
FIG. 23 illustrates a cut-away view of a subsequent stage of the present invention process.
Figure 24:
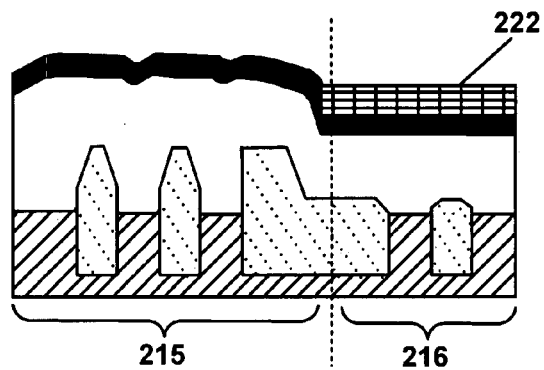
FIG. 24 illustrates a cut-away view of a subsequent stage of the present invention process.
Figure 25:
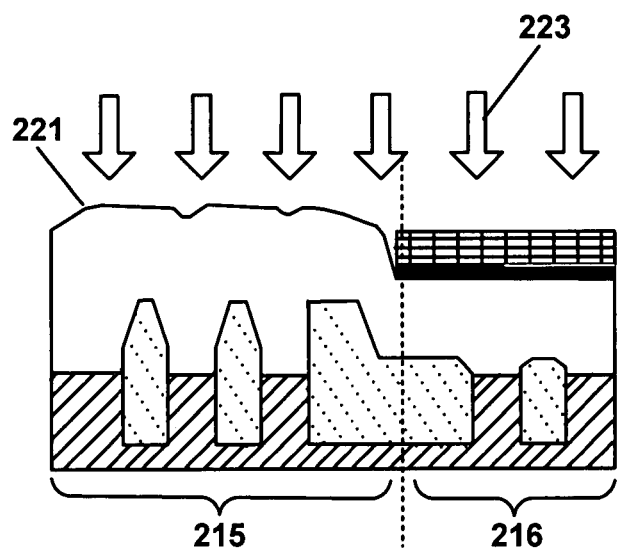
FIG. 25 illustrates a cut-away view of a subsequent stage of the present invention process.
Figure 26:
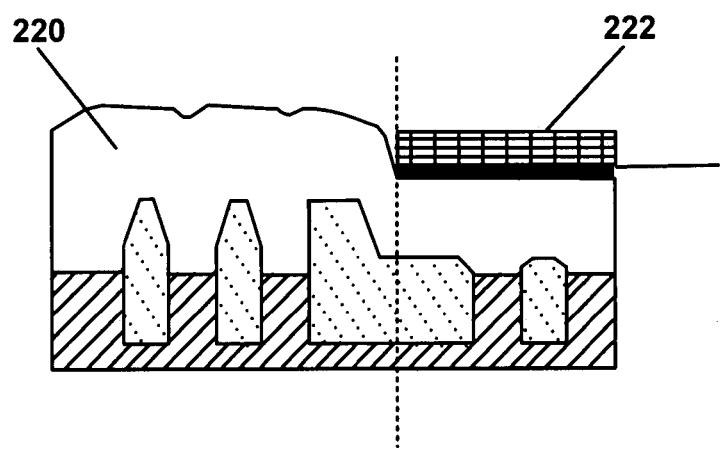
FIG. 26 illustrates a cut-away view of a subsequent stage of the present invention process.
Figure 27:
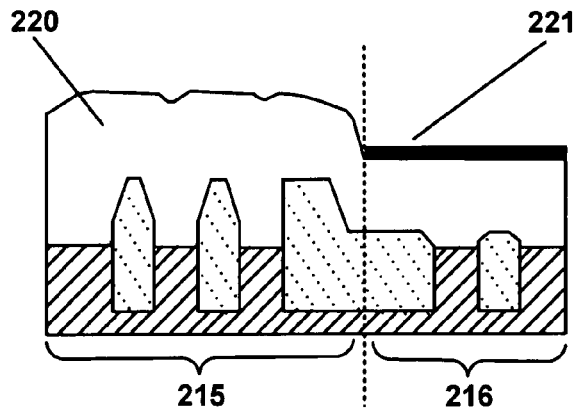
FIG. 27 illustrates a cut-away view of a subsequent stage of the present invention process.

Following the nitride strip, a layer of polysilicon is deposited 220, as shown in FIG. 22. This deposition forms the poly-1 layer 220 over the core 215 and periphery 216. As depicted in FIG. 23, following poly-1 220 deposition, a thin hard oxide or other hard masking material 221 is deposited on top of the poly-1 layer 220. The thin hard oxide layer 221 is also known as an oxide hardmask. In a preferred embodiment of the present invention, a next step is the lithographic application of a second complimentary non-critical mask 222 on top of the thin hard mask 221, masking the periphery 216 and leaving the core 215 exposed, as shown in FIG. 24. FIG. 25 shows the next step: the exposed thin hard mask 221 is etched away. FIG. 26 depicts the result of etch 223. As illustrated in FIG. 26, the poly-1 layer 220 over the periphery 216 is masked, while the poly-1 220 over the core 215 is exposed. The second complimentary non-critical mask 222 is then etched away, leaving a thin hard oxide mask 221 over the periphery 216, as shown in FIG. 27.

Figure 28:
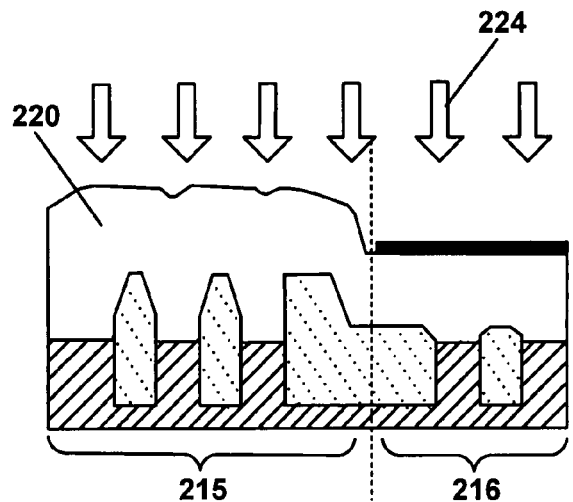
FIG. 28 illustrates a cut-away view of a subsequent stage of the present invention process.
Figure 29:
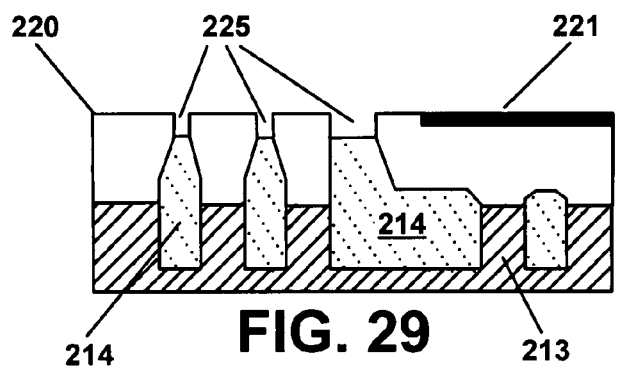
FIG. 29 illustrates a cut-away view of a subsequent stage of the present invention process.
Figure 30:
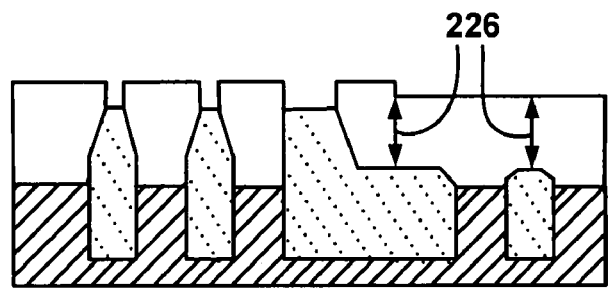
FIG. 30 illustrates a cut-away view of a subsequent stage of the present invention process.

Following the removal of the second complimentary mask 222, CMP 224 is applied to the wafer, as shown in FIG. 28. CMP 224 is applied until the polysilicon 220 is planar with the thin hard oxide mask 221. At this point, the tops of the core oxide mesas 225 are exposed. This is a self-aligning method for properly defining the poly-1 layer 220 over the core 215. FIG. 29 illustrates the cross section of a portion of the wafer after CMP 224 is stopped. Following CMP 224, the thin hard oxide mask 221 is etched away, leaving the poly-1 layer 220 properly defined and ready for the next step in the fabrication process. FIG. 30 depicts the wafer after poly-1 definition in accordance with the present invention.

The increased thickness of the nitride layer 211 within the trench-etch mask 232 creates very tall core oxide mesas 228, which is desirable. The nitride layer is deposited to a depth of 1000-1700 angstroms. The recessing etch 219 of the periphery trench oxides 218, shown in FIG. 18, ensure that the periphery oxides 218 will be covered with an adequate thickness 226 of polysilicon 220, post poly-1 definition, as illustrated in FIG. 30.

Figure 31A:
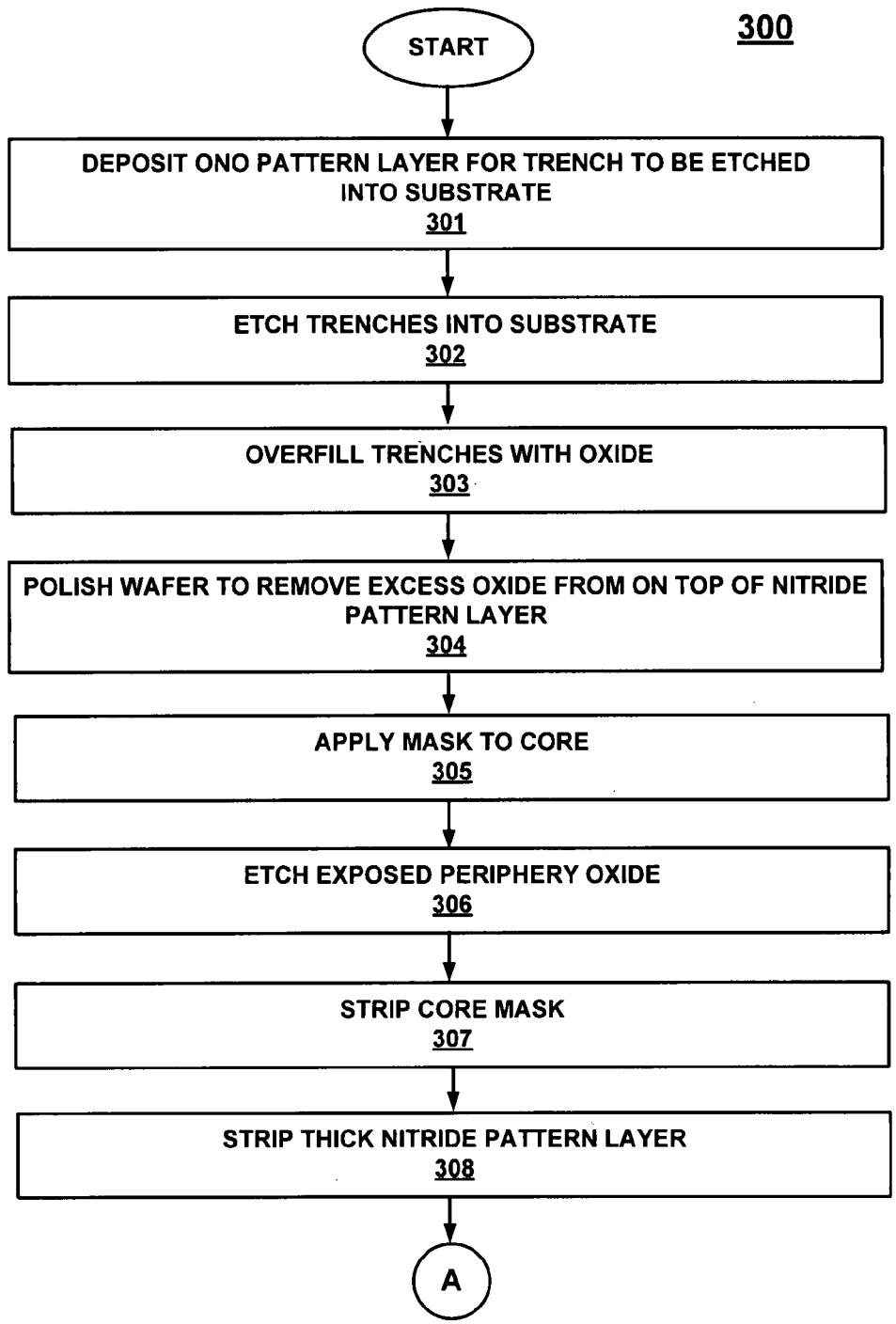
FIG. 31A is a flow chart depicting a first part of poly-1 deposition in accordance with the present invention.
Figure 31B:
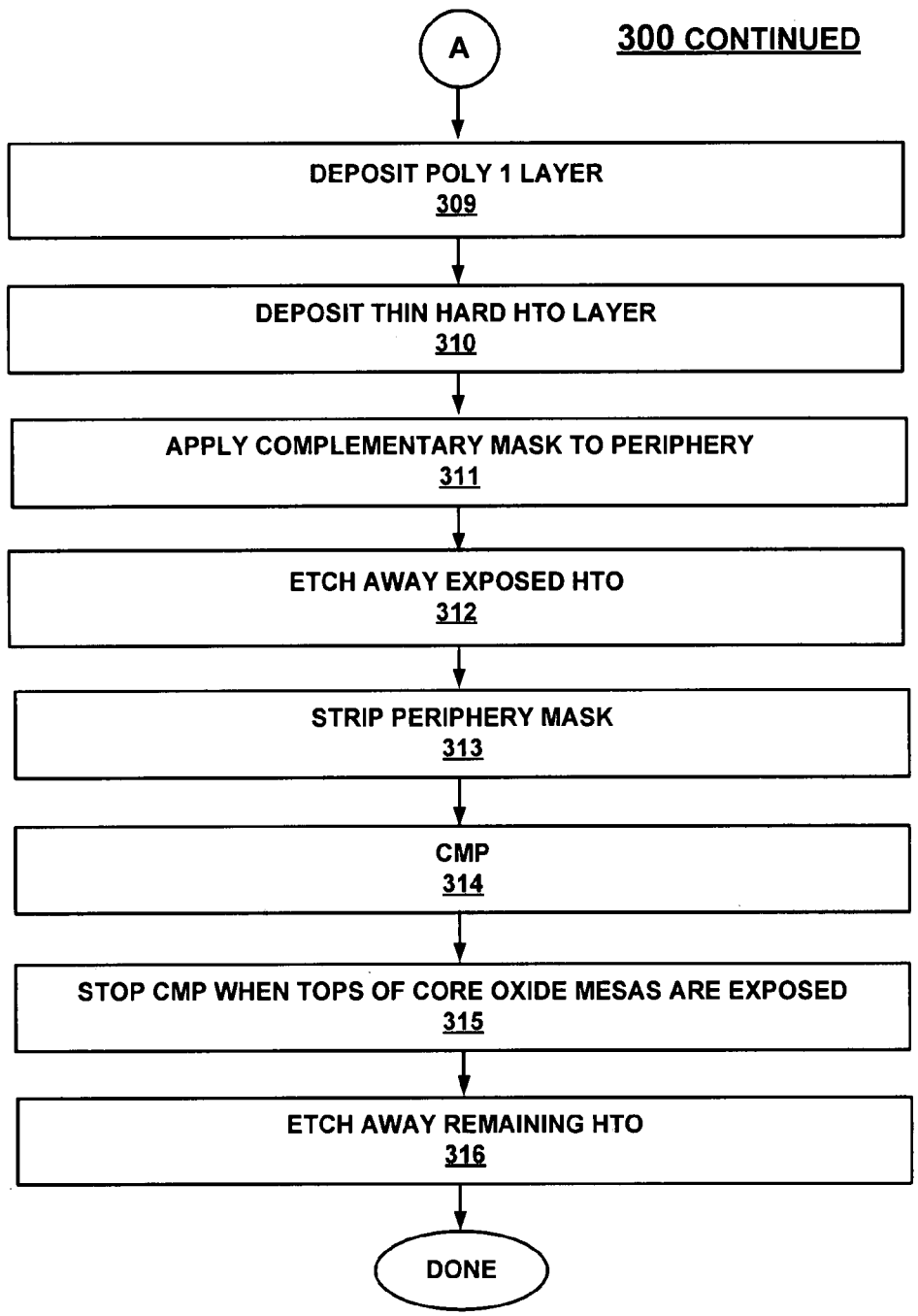
FIG. 31B is a continuation of FIG. 31A, a flow chart depicting a second part of poly-1 deposition in accordance with the present invention.

Flowchart 300, the first part of which is shown in FIG. 31A, displays steps of the present invention in a preferred order. First, a thick nitride layer on top of the substrate is patterned for trench formation 301. Following the nitride pattern creation 301, the trenches are etched into the substrate 302. Following trench formation 302, a layer of oxide material is deposited on the substrate until the trenches are over-filled 303. Following oxide overfill 303, the wafer is polished to remove excess oxide material from on top of the nitride pattern layer 304. Following the removal of excess oxide material 304, a first non-critical mask is applied to the core 305. While the first non-critical mask is in place over the core, the periphery is etched to recess the exposed oxides in the peripheral trenches 306 by an amount approximately equal to the final poly-1 layer thickness. After the peripheral oxide etch 306, the first non-critical mask over the core is stripped 307, followed by the stripping of the nitride pattern layer 308.

Continuing flowchart 300 in FIG. 32B, box 309 contains a next step in a preferred embodiment of the present invention: the deposition of polysilicon for the formation of the poly-1 layer. Following poly-1 deposition 309, a thin hard oxide layer is deposited over the wafer 310. In a preferred embodiment, the thin hard oxide layer comprises High Thermal Oxide (HTO). After the thin hard oxide layer is deposited 310, a second, complimentary non-critical mask is applied to the core 311. The second, complimentary non-critical mask is approximately a reverse of the first non-critical mask. The first mask covered the core and left the periphery exposed. The second mask covers the periphery and scribe line areas and leaves the core exposed, once the thin hard oxide layer not covered by the complimentary non-critical mask is etched away 312. The remaining hard oxide layer is a good stopping mask for chemical-mechanical planarization process, so the complimentary non-critical mask over the periphery can be stripped away 313. After the second, complimentary mask is removed 313, a thin hard oxide mask remains over the periphery. Chemical-mechanical polishing (CMP) is then applied to the wafer 315. Once poly-1 layer over the core is polished even with the hard oxide mask, the tops of the oxide mesas in the core are exposed and CMP is stopped 314. The remaining hard oxide layer is then etched away 316, leaving the poly-1 layer properly defined.

While the method illustrated in flow charts 300 shows a specific sequence and quantity of steps, the present invention is suitable to alternative embodiments. For example, the sequence of the steps may be modified to produce the same desired poly-1 definition using the complimentary masking approach of the present invention. Also, not all the steps provided for in the methods illustrated in flow chart 300 are required for the present invention. Furthermore, additional steps can be added to the steps presented in the present embodiment. Likewise, the sequences of the steps can be modified depending upon the application.

The preferred embodiments of the present invention, a complimentary masking method for defining the poly-1 layer of a semiconductor device during wafer fabrication, is thus described. While the present invention has been described in particular embodiments, it should be appreciated that the present invention should not be construed as limited by such embodiments, but rather construed according to the below claims.

What is claimed is:

1. A method of defining a poly-1 layer of a semiconductor chip, said semiconductor chip comprising a core memory area and a peripheral region, comprising:

depositing a thick nitride barrier level above a substrate of said semiconductor chip;

etching shallow isolation trenches into said nitride layer and said substrate;

filling said shallow isolation trenches with oxide material;

removing excess of said oxide material from on top of remainder of said nitride layer;

depositing a first non-critical mask on said core memory area, leaving said peripheral region exposed;

recessing said oxide material in said exposed peripheral region by an amount approximately equal to a final polysilicon thickness;

stripping said first non-critical mask;

stripping a remainder of said nitride barrier layer, thereby leaving mesas of oxide material in said core memory area;

depositing a layer of polysilicon, called the poly-1 layer, over said core memory area and said peripheral region;

depositing a thin hard mask over said core memory area and said peripheral region;

depositing a second non-critical complimentary mask over said peripheral region;

etching away an exposed portion of said thin hard mask over said core memory area;

polishing an exposed core memory area to remove said polysilicon from on top of said mesas of field oxide in said core memory area;

stripping said complimentary mask;

stripping a remaining portion of said thin hard mask.

2. The method of claim 1, wherein said thick nitride layer deposited to a depth of 1000-1700 angstroms.

3. The method of claim 1, wherein said thick nitride layer is deposited on top of a thin layer of oxide material.

4. The method of claim 1, wherein said polishing to remove said excess field oxide from on top of remainder of said nitride layer is accomplished by chemical mechanical polishing (CMP).

5. The method of claim 1, wherein said recessing of said field oxide is accomplished by a wet etch.

6. The method of claim 1, wherein said recessing of said field oxide is accomplished by a dry etch.

7. The method of claim 1, wherein said mesas of field oxide remaining in said core memory area after said nitride stripping have heights of 500-1000 angstroms.

8. The method of claim 1, wherein said complimentary mask comprises an oxide hardmask.

9. The method of claim 1, wherein said polishing of said exposed core memory area to remove said polysilicon from on top of mesas of field oxide in said core memory area comprises chemical mechanical planarization.

10. The method of claim 1 further comprising:

depositing a layer of photoresist on said thick nitride barrier layer;

lithographically patterning at least one shallow isolation trench onto said nitride barrier layer.

* * * * *